(12) United States Patent
Chang et al.

(10) Patent No.: US 10,025,969 B2
(45) Date of Patent: Jul. 17, 2018

(54) FINGERPRINT IDENTIFICATION MODULE AND MANUFACTURING METHOD THEREOF

(71) Applicant: PRIMAX ELECTRONICS LTD., Taipei (TW)

(72) Inventors: Ching-Hui Chang, Taipei (TW); Tung-Ying Wu, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 15/434,140

(22) Filed: Feb. 16, 2017

(65) Prior Publication Data

US 2017/0243047 A1 Aug. 24, 2017

Related U.S. Application Data

(60) Provisional application No. 62/298,837, filed on Feb. 23, 2016.

(51) Int. Cl.
*G06K 9/00* (2006.01)

(52) U.S. Cl.
CPC ....... *G06K 9/00013* (2013.01); *G06K 9/0002* (2013.01); *G06K 9/00053* (2013.01); *G06K 9/00087* (2013.01)

(58) Field of Classification Search
CPC ............. G06K 9/0002; G06K 9/00087; G06K 9/00053
See application file for complete search history.

(56) References Cited

U.S. PATENT DOCUMENTS

2014/0140588 A1* 5/2014 Chou ................... G06K 9/0002
382/124
2017/0213097 A1* 7/2017 Vogel ................. G06K 9/00013

* cited by examiner

*Primary Examiner* — Ruiping Li
(74) *Attorney, Agent, or Firm* — Kirton McConkie; Evan R. Witt

(57) ABSTRACT

A fingerprint identification module includes a substrate, a sensing die, a mold compound layer and a circuit board. The substrate includes plural electrical contacts. The plural electrical contacts are exposed outside the substrate. The sensing die is attached on the substrate and electrically connected with the substrate so as to sense a fingerprint image. The mold compound layer is formed on the substrate to encapsulate the sensing die. The circuit board includes plural connection pads. The circuit board and the substrate are electrically connected with each other through the plural connection pads and the plural electrical contacts. The substrate and the circuit board are not integrally formed with each other.

9 Claims, 5 Drawing Sheets

FINGERPRINT IDENTIFICATION MODULE AND MANUFACTURING METHOD THEREOF

CROSS-REFERENCE TO RELATED APPLICATION

This application claims priority to U.S. Provisional Patent Application No. 62/298,837 filed Feb. 23, 2016, the contents of which are incorporated herein by reference.

FIELD OF THE INVENTION

The present invention relates to a biometric identification device, and more particularly to a fingerprint identification module.

BACKGROUND OF THE INVENTION

Recently, a fingerprint identification technology has been applied to a variety of electronic products. By using the fingerprint identification technology, the user's fingerprint can be inputted into an electronic product and saved in the electronic product. For unlocking the electronic product, the user has to input the fingerprint through a fingerprint identification module. The way of unlocking the electronic product by the fingerprint identification technology is faster and more user-friendly than the way of manually inputting the password. Consequently, the fingerprint identification technology is favored by many users, and the demands on the fingerprint identification module are gradually increased.

The structure of a fingerprint identification module will be described as follows. FIG. 1 is a schematic cross-sectional side view illustrating the structure of a conventional fingerprint identification module. As shown in FIG. 1, the fingerprint identification module 1 comprises a sensing die 11, a rigid circuit board 12, a flexible circuit board 13 and a mold compound layer 14. The sensing die 11 is attached on the flexible circuit board 13. In addition, the sensing die 11 is connected with the flexible circuit board 13 by a wire bonding process. The top surface of the sensing die 11 and the top surface of the flexible circuit board 13 are covered by the mold compound layer 14. The sensing die 11, the flexible circuit board 13 and the mold compound layer 14 are collaboratively defined as a fingerprint sensor 10. Moreover, the flexible circuit board 13 is stacked on the rigid circuit board 12 and electrically connected with the rigid circuit board 12.

A method of manufacturing a fingerprint identification module will be described as follows. FIG. 2 is a schematic top view illustrating a sensing strip for producing a fingerprint sensor according to the prior art. The sensing strip 2 comprises plural unseparated fingerprint identification modules 1. The structure of the fingerprint identification module 1 is shown in FIG. 1. In the conventional method of manufacturing the fingerprint identification module, the sensing strip 2 is cut into plural blocks 21 according to the required shape. Each block 21 contains one fingerprint identification module 1. By cutting the sensing strip 2, plural individual fingerprint identification modules 1 are manufactured. However, the conventional method still has some drawbacks. For example, as shown in FIG. 2, the area of the discarded region 22 of the sensing strip 2 (i.e., the region indicated by oblique lines) is very large. Since the material utilization of the sensing strip 2 is low, the material cost is high. Moreover, if the sensing strip contains plural fingerprint identification modules 1 with different shapes, the area of the discarded region of the sensing strip increases. Under this circumstance, the material utilization is impaired.

Therefore, there is a need of providing a fingerprint identification module with enhanced material utilization.

SUMMARY OF THE INVENTION

The present invention provides a fingerprint identification module with enhanced material utilization.

The present invention also provides a method for manufacturing a fingerprint identification module with enhanced material utilization.

In accordance with an aspect of the present invention, there is provided a fingerprint identification module. The fingerprint identification module includes a substrate, a sensing die, a mold compound layer and a circuit board. The substrate includes plural electrical contacts. The plural electrical contacts are exposed outside the substrate. The sensing die is attached on the substrate and electrically connected with the substrate so as to sense a fingerprint image. The mold compound layer is formed on the substrate to encapsulate the sensing die. The circuit board includes plural connection pads. The circuit board and the substrate are electrically connected with each other through the plural connection pads and the plural electrical contacts. The substrate and the circuit board are not integrally formed with each other.

In accordance with another aspect of the present invention, there is provided a manufacturing method of a fingerprint identification module. The manufacturing method includes the following steps. Firstly, a first sensing strip is provided, and the first sensing strip is into plural individual fingerprint sensors. The plural individual fingerprint sensors include plural substrates, plural sensing dies and plural mold compound layers, respectively. Then, a second sensing strip is provided, and the second sensing strip is cut into plural individual circuit boards. Then, the plural substrates of the plural individual fingerprint sensors and the corresponding individual circuit boards are combined together. Consequently, the plural substrates and the corresponding individual circuit boards are electrically connected with each other.

From the above descriptions, the fingerprint sensor and the circuit board of the fingerprint identification module are individual structures. That is, the fingerprint sensor and the circuit board are not integrally formed. Since the areas of the discarded regions of the first sensing strip and the second sensing strip are reduced, the material utilization is enhanced. In case that the size of the sensing strip is not increased, the method of the present invention can be employed to produce more fingerprint identification modules. In addition, the area of the discarded region (cut-off region) of the sensing strip is largely reduced.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

For solving the drawbacks of the conventional technologies, the present invention provides a fingerprint identification module and a method for manufacturing the fingerprint identification module.

Hereinafter, the structure of the fingerprint identification module will be illustrated with reference to FIGS. 3 and 4.

Figure 1:
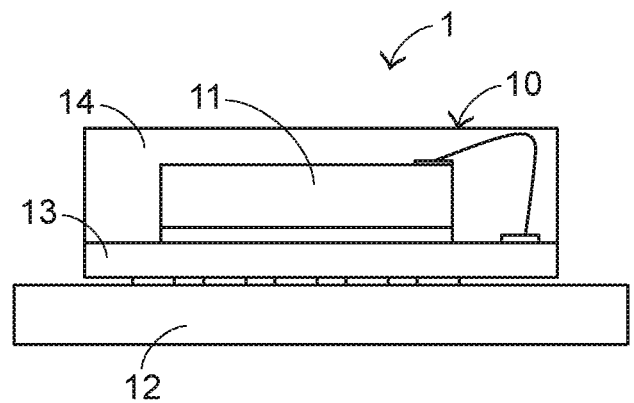
FIG. 1 is a schematic cross-sectional side view illustrating the structure of a conventional fingerprint identification module.
Figure 2:
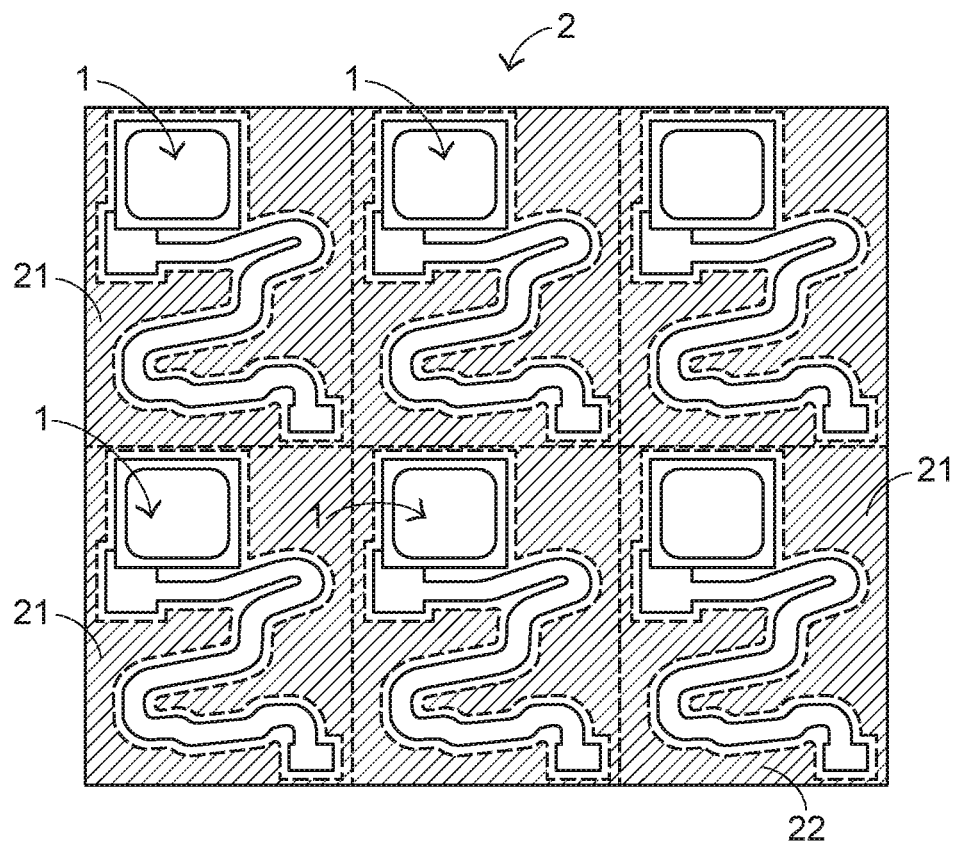
FIG. 2 is a schematic top view illustrating a sensing strip for producing a fingerprint sensor according to the prior art.
Figure 3:
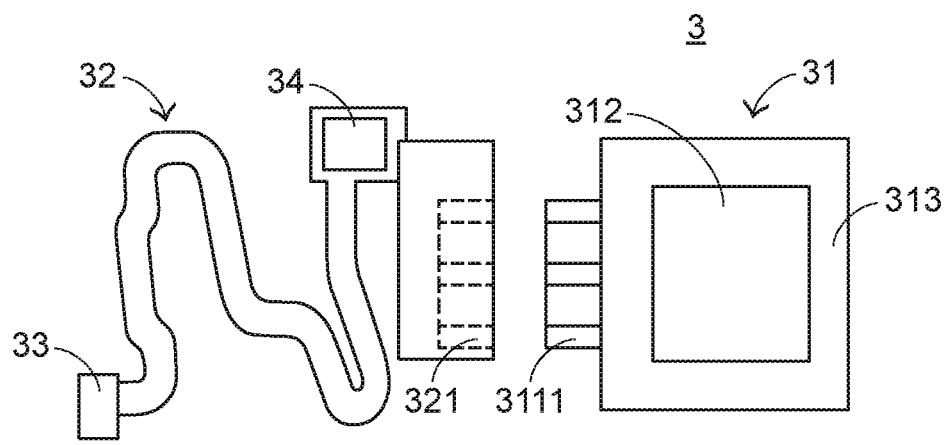
FIG. 3 is a schematic exploded and top view illustrating a fingerprint identification module according to a first embodiment of the present invention.

FIG. 3 is a schematic exploded and top view illustrating a fingerprint identification module according to a first embodiment of the present invention. FIG. 4 is a schematic exploded and side view illustrating the fingerprint identification module according to the first embodiment of the present invention. The fingerprint identification module 3 comprises a fingerprint sensor 31, a circuit board 32, a connector 33 and a chip 34. The fingerprint sensor 31 comprises a substrate 311, a sensing die 312 and a mold compound layer 313. The substrate 311 comprises plural electrical contacts 3111. The plural electrical contacts 3111 are exposed to a top surface of the substrate 311. The sensing die 312 is attached on the substrate 311 and electrically connected with the substrate 311. The sensing die 312 can sense the fingerprint image of a finger. Moreover, plural conductive parts (not shown) are formed on the substrate 311 and arranged around the sensing die 312. The sensing die 312 is connected with the conductive parts through wires W, and thus the sensing die 312 and the substrate 311 are electrically connected with each other. That is, the sensing die 312 is connected with the substrate 311 by a wire bonding process. The mold compound layer 313 is formed on the substrate 311 to encapsulate the sensing die 312. In an embodiment, the mold compound layer 313 is made of an epoxy molding compound (EMC).

The circuit board 32 comprises plural connection pads 321. The plural connection pads 321 are exposed to a bottom surface of the circuit board 32. Moreover, the circuit board 32 and the substrate 311 are electrically connected with each other through the plural connection pads 321 and the plural electrical contacts 3111. The connector 33 is disposed on the circuit board 32. Moreover, the connector 33 can be connected with an external electronic device such as a smart phone or a tablet computer. The chip 34 is disposed on the circuit board 32. The chip 34 can filter off the noise of the fingerprint image. In accordance with a feature of the present invention, the substrate 311 and the circuit board 32 are not integrally formed with each other. In an embodiment, both of the substrate 311 and the circuit board 32 are flexible printed circuits (FPC).

Figure 5:
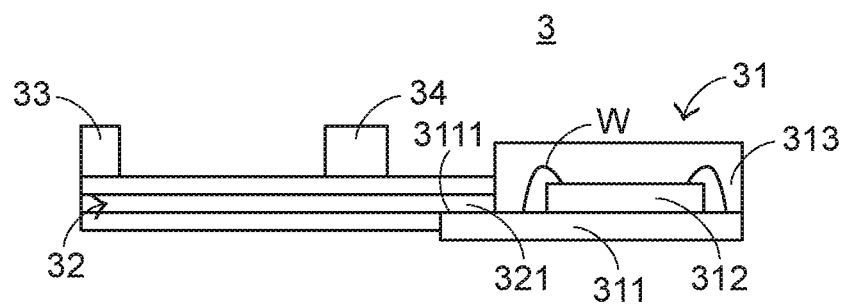
FIG. 5 is a schematic side view illustrating the fingerprint identification module according to the first embodiment of the present invention.

FIG. 5 is a schematic side view illustrating the fingerprint identification module according to the first embodiment of the present invention. As shown in FIG. 5, the substrate 311 of the fingerprint sensor 31 and the circuit board 32 are combined as the fingerprint identification module 3. When the substrate 311 and the circuit board 32 are combined together, the electrical contacts 3111 are contacted and connected with the corresponding connection pads 321. Consequently, the electric connection between the fingerprint sensor 31 and the circuit board 32 is established.

Figure 6:
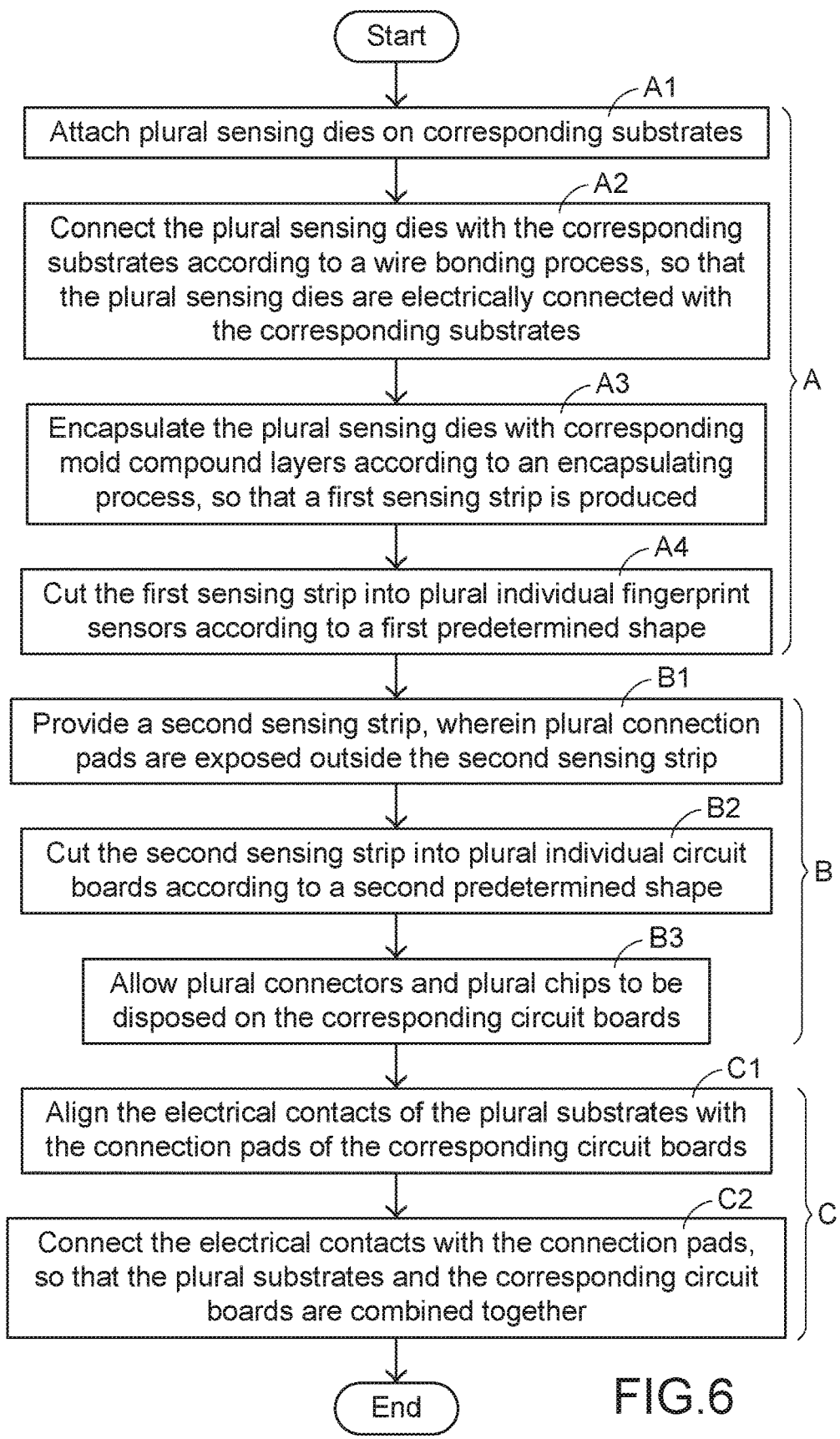
FIG. 6 schematically illustrates a flowchart of a method for manufacturing the fingerprint identification module according to the first embodiment of the present invention.

A method for manufacturing the fingerprint identification module will be described as follows. FIG. 6 schematically illustrates a flowchart of a method for manufacturing the fingerprint identification module according to the first embodiment of the present invention. The manufacturing method comprises the following steps.

In a step A, a first sensing strip is provided, and the first sensing strip is cut into plural individual fingerprint sensors.

In a step B, a second sensing strip is provided, and the second sensing strip is cut into plural individual circuit boards.

In a step C, plural substrates of the plural individual fingerprint sensors and the corresponding individual circuit boards are combined together, and thus the plural substrates of the plural individual fingerprint sensors are electrically connected with the corresponding circuit boards.

The step A comprises steps A1, A2, A3 and A4. In the step A1, plural sensing dies are attached on corresponding substrates. In the step A2, the plural sensing dies are connected with the corresponding substrates according to a wire bonding process. Consequently, the plural sensing dies are electrically connected with the corresponding substrates. In the step A3, the plural sensing dies are encapsulated with corresponding mold compound layers according to an encapsulating process. After the step A3 is completed, the first sensing strip is produced. In the step A4, the first sensing strip is cut into the plural individual fingerprint sensors according to a first predetermined shape.

The step B comprises steps B1, B2 and B3. In the step B1, the second sensing strip is provided, and plural connection pads are exposed outside the second sensing strip. In the step B2, the second sensing strip is cut into the plural individual circuit boards according to a second predetermined shape. In the step B3, plural connectors and plural chips are disposed on the corresponding circuit boards.

The step C comprises steps C1 and C2. In the step C1, the electrical contacts of the plural substrates are aligned with the connection pads of the corresponding circuit boards. In the step C2, the electrical contacts of the plural substrates are connected with the connection pads of the corresponding circuit boards. Consequently, the substrates and the corresponding circuit boards are combined together.

Figure 4:
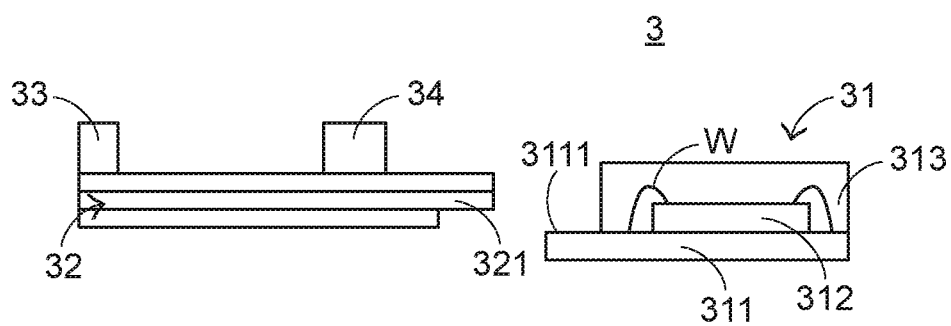
FIG. 4 is a schematic exploded and side view illustrating the fingerprint identification module according to the first embodiment of the present invention.
Figure 7:
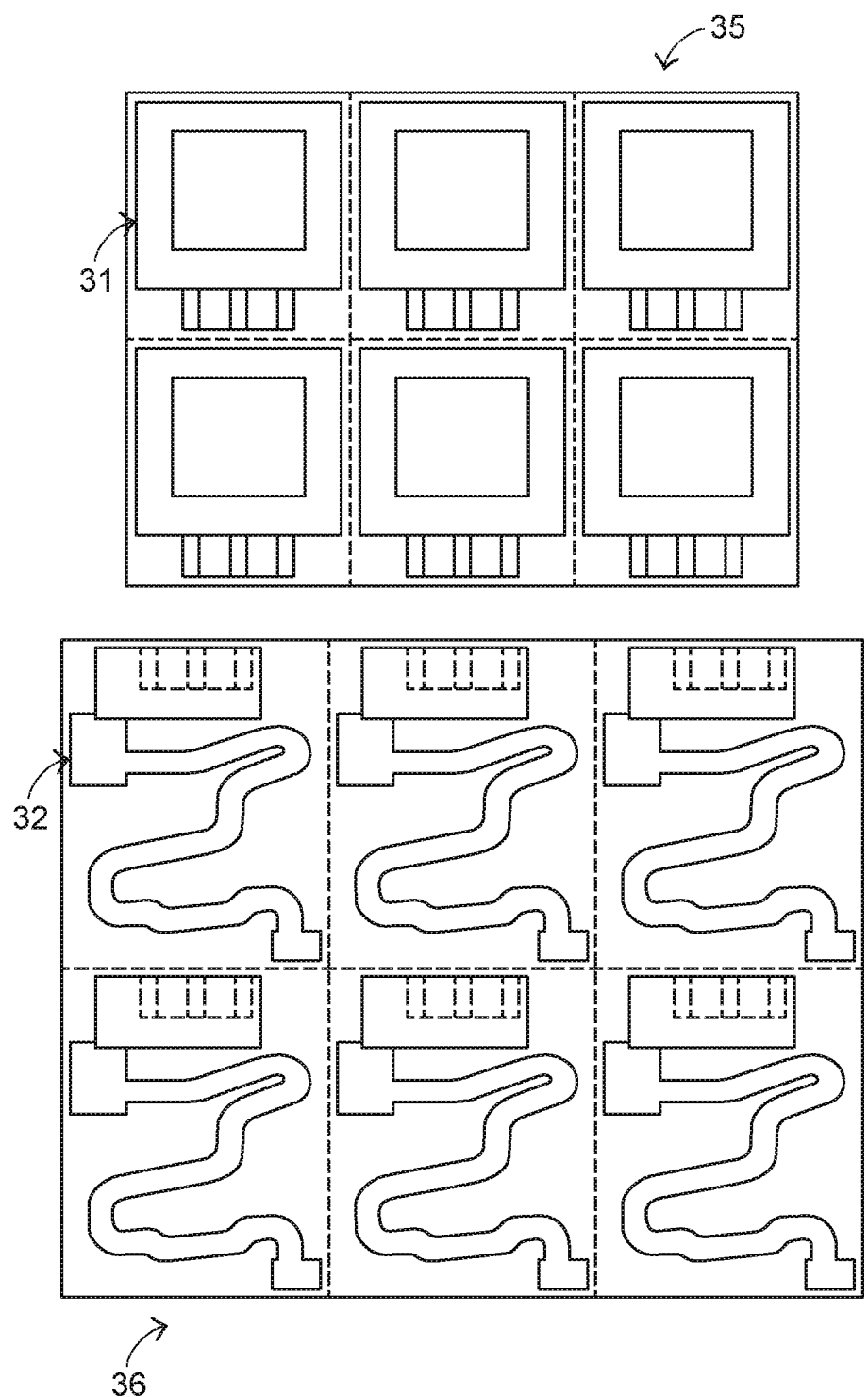
FIG. 7 is a schematic top view illustrating the first sensing strip and the second strip for producing the manufacturing the fingerprint identification module according to the first embodiment of the present invention.

Please refer to FIGS. 4, 6 and 7. FIG. 7 is a schematic top view illustrating the first sensing strip and the second sensing strip for producing the manufacturing the fingerprint identification module according to the first embodiment of the present invention. After the method for manufacturing the fingerprint identification module is started, the steps A1, A2 and A3 are performed to produce a first sensing strip 35.

Firstly, plural sensing dies 312 are attached on corresponding substrates 311. Then, the plural sensing dies 312 are connected with the corresponding substrates 311 according to a wire bonding process. Consequently, the plural sensing dies 312 are electrically connected with the corresponding substrates 311. Then, the plural sensing dies 312 are encapsulated with corresponding mold compound layers 313 according to an encapsulating process. Consequently, the first sensing strip 35 is produced. Then, the first sensing strip 35 is cut into the plural individual fingerprint sensors 31 according to a first predetermined shape (e.g. a shape designated by the customer). In addition, the electrical contacts 3111 of each fingerprint sensors 31 are exposed to a top surface of the substrate 311. The cut-off region of the first sensing strip 35 is defined as a discarded region.

After the step A is completed, a second sensing strip 36 is provided (Step B1). Then, in the step B2, the second sensing strip 36 is cut into the plural individual circuit boards 32 according to a second predetermined shape (e.g. a shape designated by the customer). In addition, plural connection pads 321 are exposed outside the circuit boards 32. The cut-off region of the second sensing strip 36 is also defined as the discarded region. After the circuit boards 32 are formed, plural connectors 33 and plural chips 34 are disposed on the corresponding circuit boards 32. In an embodiment, the plural connection pads 321 are exposed after the step B2 is performed. In another embodiment, the plural connection pads 321 are exposed after the step B1 is performed.

After the steps of cutting the first sensing strip 35 and the second sensing strip 36 are completed, the steps C1 and C2 are performed. The electrical contacts 3111 of the plural substrates 311 are aligned with the connection pads 321 of the corresponding circuit boards 32, and the electrical contacts 3111 are connected with the corresponding connection pads 321. Consequently, the substrate 311 and the corresponding circuit boards 32 are combined together. In an embodiment, the electrical contacts 3111 and the corresponding connection pads 321 are combined together through a conductive adhesive, a welding means or a wire bonding process. Preferably but not exclusively, the conductive adhesive is an anisotropic conductive film (ACF).

The following two aspects should be specially described. Firstly, the sequences of the step A and the step B may be exchanged, or the step A and the step B may be simultaneously performed. However, the sequences of performing the step A and the step B are earlier than the step C. Secondly, in the fingerprint identification module 3, the electrical contacts 3111 of the substrate 311 and the connection pads 321 of the circuit board 32 are wide enough. Consequently, in the step C1, the electrical contacts 3111 can be easily aligned with the connection pads 321 without requiring high alignment precision.

After the above steps are completed, the individual fingerprint sensor 31 and the individual circuit board 32 are combined as the fingerprint identification module 3. Since the areas of the discarded regions (cut-off regions) of the first sensing strip 35 and the second sensing strip 36 are reduced when compared with the conventional technology, the material utilization is enhanced.

Figure 8:
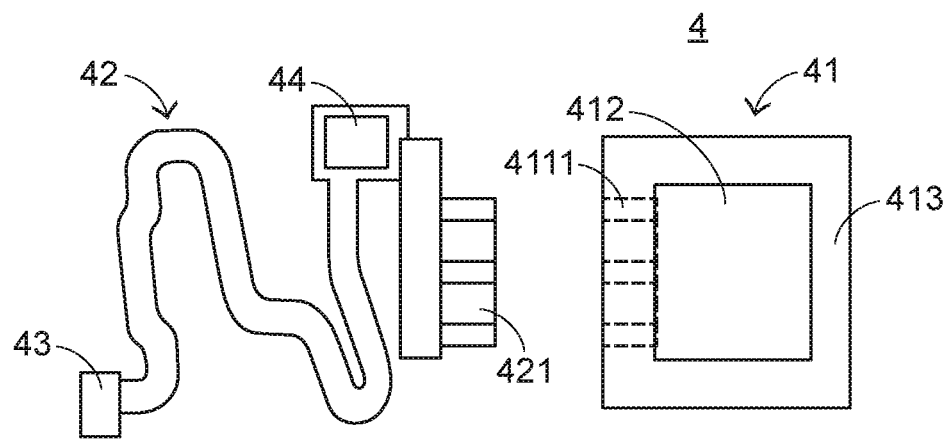
FIG. 8 is a schematic exploded and top view illustrating a fingerprint identification module according to a second embodiment of the present invention.
Figure 9:
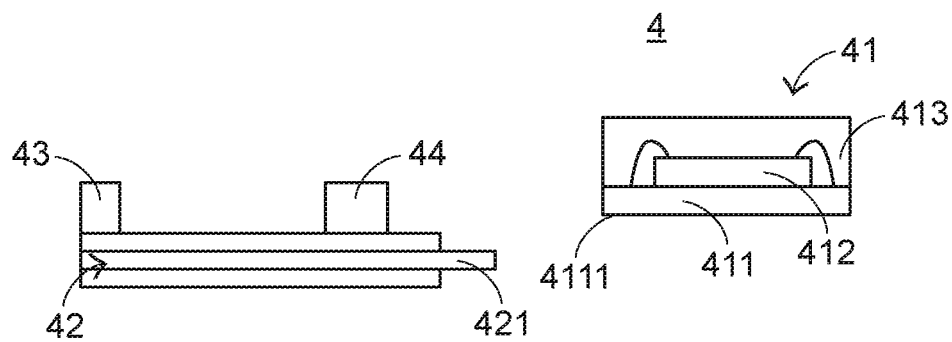
FIG. 9 is a schematic exploded and side view illustrating the fingerprint identification module according to the second embodiment of the present invention.
Figure 10:
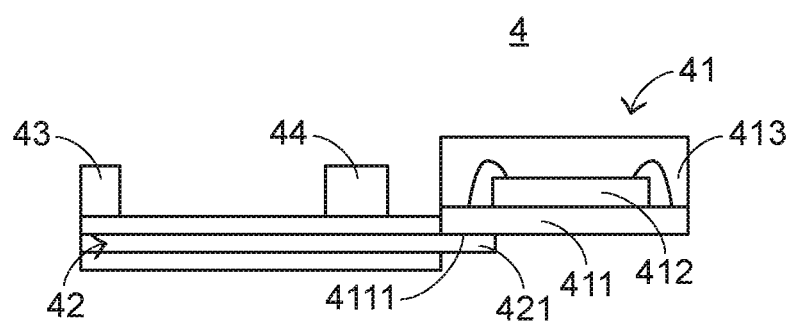
FIG. 10 is a schematic side view illustrating the fingerprint identification module according to the second embodiment of the present invention.

The present invention further provides a second embodiment, which is distinguished from the first embodiment. Please refer to FIGS. 8, 9 and 10. FIG. 8 is a schematic exploded and top view illustrating a fingerprint identification module according to a second embodiment of the present invention. FIG. 9 is a schematic exploded and side view illustrating the fingerprint identification module according to the second embodiment of the present invention. FIG. 10 is a schematic side view illustrating the fingerprint identification module according to the second embodiment of the present invention. The fingerprint identification module 4 comprises a fingerprint sensor 41, a circuit board 42, a connector 43 and a chip 44. The fingerprint sensor 41 comprises a substrate 411, a sensing die 412 and a mold compound layer 413. The substrate 411 comprises plural electrical contacts 4111. The circuit board 42 comprises plural connection pads 421.

The structures and functions of the components of the fingerprint identification module 4 that are similar to those of the first embodiment are not redundantly described. In comparison with the above embodiment, the following aspects of the fingerprint identification module 4 are distinguished. For example, the plural electrical contacts 4111 are exposed to a bottom surface of the substrate 411, and the plural connection pads 421 are exposed to a top surface of the circuit board 42. After the substrate 411 of the fingerprint sensor 41 and the circuit board 42 are combined together, the resulting structure of the fingerprint identification module 4 is shown in FIG. 10. The method of manufacturing the fingerprint identification module 4 is similar to that of the first embodiment, and is not redundantly described herein.

From the above descriptions, the fingerprint sensor and the circuit board of the fingerprint identification module are individual structures. That is, the fingerprint sensor and the circuit board are not integrally formed. Since the areas of the discarded regions of the first sensing strip and the second sensing strip are reduced, the material utilization is enhanced. In case that the size of the sensing strip is not increased, the method of the present invention can be employed to produce more fingerprint identification modules. Since the area of the discarded region (cut-off region) is reduced, the fingerprint identification module and the manufacturing method of the present invention can overcome the drawbacks of the conventional technology.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A fingerprint identification module, comprising:
   a substrate comprising plural electrical contacts;
   a sensing die attached on the substrate and electrically connected with the substrate so as to sense a fingerprint image;
   a mold compound layer formed on the substrate, and encapsulating the sensing die, wherein the plural electrical contracts are exposed outside the mold compound layer;
   a circuit board comprising plural connection pads, wherein the circuit board and the substrate are electrically connected with each other through the plural connection pads and the plural electrical contacts, and the substrate and the circuit board are not integrally formed with each other;
   a connector disposed on the circuit board, and connected with an external electronic device; and
   a chip disposed on the circuit board for filtering off noise of the fingerprint image.

2. The fingerprint identification module according to claim 1, wherein the plural electrical contacts and the plural connection pads are connected with each other through a conductive adhesive, a welding means or a wire bonding process.

3. The fingerprint identification module according to claim 1, wherein the plural electrical contacts are exposed to a top surface of the substrate, and the plural connection pads are exposed to a bottom surface of the circuit board.

4. The fingerprint identification module according to claim 1, wherein the plural electrical contacts are exposed to a bottom surface of the substrate, and the plural connection pads are exposed to a top surface of the circuit board.

5. A manufacturing method of a fingerprint identification module, the manufacturing method comprising steps of:
  (A) providing a first sensing strip, and cutting the first sensing strip into plural individual fingerprint sensors, wherein the plural individual fingerprint sensors comprise plural substrates, plural sensing dies to sense a fingerprint image and plural mold compound layers, respectively;
  (B) providing a second sensing strip, and cutting the second sensing strip into plural individual circuit boards, wherein each individual circuit board comprises a chip disposed thereon for filtering off noise of the fingerprint image; and
  (C) combining the plural substrates of the plural individual fingerprint sensors and the corresponding individual circuit boards together, so that the plural substrates and the corresponding individual circuit boards are electrically connected with each other.

6. The manufacturing method according to claim 5, wherein the step (A) comprises steps of:
  (A1) attaching the plural sensing dies on the corresponding substrates, wherein plural conductive parts are formed on the substrates and arranged around the sensing dies;
  (A2) connecting the plural sensing dies with the corresponding substrates according to a wire bonding process, so that the plural sensing dies are electrically connected with the corresponding substrates;
  (A3) encapsulating the plural sensing dies with corresponding mold compound layers according to an encapsulating process, so that a first sensing strip is produced; and
  (A4) cutting the first sensing strip into plural individual fingerprint sensors according to a predetermined shape, wherein plural electrical contacts of each substrate are exposed outside the mold compound layers.

7. The manufacturing method according to claim 5, wherein the step (B) comprises steps:
  (B1) providing a second sensing strip; and
  (B2) cutting the second sensing strip into plural individual circuit boards according to another predetermined shape.

8. The manufacturing method according to claim 5, wherein the step (C) comprises steps:
  (C1) aligning the electrical contacts of the plural substrates with connection pads of the corresponding circuit boards; and
  (C2) connecting the electrical contacts with the corresponding connection pads, so that the plural substrates and the corresponding circuit boards are combined together.

9. The manufacturing method according to claim 8, wherein the plural electrical contacts and the corresponding connection pads are connected with each other through a conductive adhesive, a welding means or a wire bonding process.

* * * * *